United States Patent
Felmlee et al.

[11] Patent Number: 5,900,732
[45] Date of Patent: May 4, 1999

[54] AUTOMATIC WINDOWING METHOD FOR MR IMAGES

[75] Inventors: Joel P. Felmlee; William Ryan; Ramesh Avula; Bradley J. Erickson, all of Rochester, Minn.

[73] Assignee: Mayo Foundation for Medical Education and Research, Rochester, Minn.

[21] Appl. No.: 08/740,800

[22] Filed: Nov. 4, 1996

[51] Int. Cl.⁶ .................................................. G01V 3/00
[52] U.S. Cl. ............................................. 324/309; 324/307
[58] Field of Search ..................... 324/300, 306, 324/307, 309, 318, 322; 382/168, 131

[56] References Cited

U.S. PATENT DOCUMENTS

| | | |
|---|---|---|
| 4,755,954 | 7/1988 | Netter ........................................ 364/518 |
| 4,789,933 | 12/1988 | Chen et al. ........................ 364/413.13 |
| 5,042,077 | 8/1991 | Burke ......................................... 382/51 |
| 5,268,967 | 12/1993 | Jang et al. .................................. 382/6 |
| 5,305,204 | 4/1994 | Ohhashi .................................. 382/168 |
| 5,321,520 | 6/1994 | Inga et al. ............................... 358/403 |
| 5,410,250 | 4/1995 | Brown ..................................... 324/309 |
| 5,438,989 | 8/1995 | Hochman et al. ................... 128/653.1 |

*Primary Examiner*—Louis Arana
*Attorney, Agent, or Firm*—Quarles & Brady, LLP

[57] ABSTRACT

An MRI system acquires NMR data and reconstructs an image. The image is enhanced prior to being displayed by automatically calculating a window level value and a window width value and mapping the reconstructed image through the resulting contrast window defined by those values.

4 Claims, 4 Drawing Sheets

AUTOMATIC WINDOWING METHOD FOR MR IMAGES

BACKGROUND OF THE INVENTION

The field of the invention is the display of magnetic resonance images, and particularly, the display of such images for maximum human visualization.

Image display technology is used to transmit visual information to human beings. Common examples are television pictures, photographic film and prints, transparency projection, and computer graphics display monitors. Such images are formed by a series of single, smallest physically resolvable elements, called pixels, in which each pixel has a brightness, or intensity level, which ranges from the blackest-black through mid-grays, to the whitest-white. Especially in the display of medical images, such as ordinary X-ray films, the brightness, or "grey scale", information is as important as the structural, anatomical or morphological information in the image.

In every image display there will be some lowest level of reliably discernable discrete step in gray-scale value, or contrast resolution. The value of the range from deepest possible "black" to whitest possible "white", divided by the value of smallest discernable step in that intensity is called the image's dynamic range. The dynamic range of image pixel values commonly is expressed logarithmically by using logarithms of base-2.

{Linear Brightness Range}/{Smallest Brightness Step}=[Bits of Dynamic Range]

This is technically convenient because it corresponds to the binary counting scheme employed to store data in digital computers. For example, if the dynamic range of an image is 12 bits, then the brightness value for each pixel in the image will require 12 bits of memory for storage.

Image data comes from a primary modality instrument such as a television camera, an X-ray machine, an ultrasound system, or a magnetic resonance imaging (MRI) system. The intensity values in the acquired data array have a one-to-one correspondence with the pixels in the final image to be displayed. The numerical intensity value stored in each location of the data array is employed to control the brightness of its corresponding display pixel.

But the originally acquired data array values usually cannot be directly transferred to the display. They do not match appropriately to the display medium, or the visual needs of the observer. For example, MRI data arrays may have values that are negative algebraically, as well as positive, and one cannot generate negative light intensity for a display. Consequently, a numerical scaling process must be used to offset the baseline level to fit the range of values in the acquired data array onto the range of values which can be displayed physically. Such "static windowing", or "contrast windowing" is a well known procedure.

While the offset image array values may in principle be physically displayable, further processing may be required to meet the needs of human observers. For example, while 12-bit intensity, or brightness, values may be presented on a CRT display, humans are not able to perceive the very small changes in brightness that such data presents. Indeed, humans have a dynamic brightness range under the best of conditions in the range of 6 to 8 bits with the result that the least significant 5 or 6 bits of the 12-bit display brightness information is not perceived. Thus, while the least significant bits of the 12-bit image array data may indicate meaningful variations of 5 or 6 bits in brightness dynamic range throughout a region of the image, the human observer may only perceive a single brightness, or shade. The loss of such information can have an enormous impact in medical applications where such detailed variations in brightness may represent important anatomical or morphological features.

One method for overcoming this problem begins by placing the average of the intensity values at the midpoint of the 6 to 8-bit useful dynamic range of the display. This method is referred to as "static contrast windowing" and it requires prior knowledge of the average value of the region of interest in the image. Such static contrast windowing is routinely performed by radiologists who adjust the X-ray exposure factors and film-screen speed to put the average X-ray transmission through the anatomical region of interest at the central sensitivity region of the film.

Such static contrast windowing is illustrated in FIG. 1 where the horizontal axis represents the entire range of intensity values which the image data may have, and the vertical axis indicates the more limited range of brightnesses on the visual display. The dashed lines 1 and 2 define the full range, or "contrast window" of intensity values which will be mapped to the display. The solid line 3 is a transfer curve which indicates how the intensity values are mapped to the display brightness values. Intensity values which are below the contrast window in value are limited to black and values above the contrast window are displayed white. An intensity value within the contrast window is mapped to a corresponding display brightness value as indicated by the arrows 4. The display value is determined by the shape of the transfer curve 3, which in FIG. 1 is a straight line.

Contrast windowing is "static" when the window and the transfer curve are fixed for the conversion of the entire image data array. Details within the intensity range of the contrast window are shown on the display within a 6 to 8 bit dynamic range. The remaining parts of the image, however, are shown either "too white" or "too black" and details therein are not perceivable. For diagnostic medical image studies, all regions of brightness may require examination for abnormal anatomic details. This requires that multiple images be displayed, each with a different contrast window which insures that anatomical details at all brightness levels will be displayed. Modern digital imaging instruments such as X-ray CT, digital-subtraction angiography, digital cassette radiography and MRI work stations have controls for setting the LEVEL, or midpoint, of the brightness window and its WIDTH.

One approach commonly used in X-ray CT practice is to employ a transfer curve that has two contrast windows. Such a dual window approach is illustrated in FIG. 2, where one window 5 is set to encompass the brightness levels around bone and the other window 6 is set to encompass the brightness levels around soft tissue. This works because the anatomy is regular, and one knows a-priori what part is soft tissue and what part is bone. It is not overwhelmingly confusing to have two regions displayed in the same shifted gray-scale in the same display. However, in any anatomic regions that are intermediate in brightness between the windowed soft tissue and bone, the X-ray CT image values become hopelessly muddled.

Another technique for mapping data brightness levels to a display having a limited dynamic range is known in the art as adaptive contrast enhancement, for which the most successful variant is "adaptive histogram equalization" (AHE). Unlike prior techniques which are "static", the AHE technique does not employ a fixed contrast window for the entire image. Instead, the AHE technique looks at each datum intensity value in the acquired data array one at a time and compares it with the values in a local surrounding spatial area, or "context region". The length and width of the context region may, for example, range from one sixth to one sixtieth of the length and width of the entire image data array. While there are many variations on the precise calculations employed with this technique, the general idea is to map the centered datum value to a display brightness which provides good contrast with respect to the other data values generally within the same context region. The calculations are performed, in principle, at each pixel location in the image data array with respect to its surrounding context region and the technique is, therefore, computationally intense. The AHE technique and some of its variations are described in "The Effectiveness of Adaptive Contrast Enhancement (in Medical Images)", Zimmerman, J. B, Ph.D. Thesis, 1985, UNC, Chapel Hill, University of Microfilms International, Ann Arbor, Mich.; "Spatially Variant Contrast Enhancement Using Local Range Modification", Fahnestock, J. D. and Schowengerdt, R. A., *Optical Engineering*, Vol. 22(3):378–381 (1983); and "Algorithms For Adaptive Histogram Equalization", Pizer, S. M., Austin, J. D. et al., SPIE Vol. 671, *Physics and Engineering of Computer Multidimensional Imaging and Processing* (1986).

A more recent technique for enabling the operator to select a static window is described in U.S. Pat. No. 5,042,077. The medical imaging equipment produces an image of the subject under study along with a histogram image which indicates the distribution of brightness levels of the image pixels. Such a histogram image is shown in FIG. 3 at 30. The histogram 30 graphically represents the total number of pixels in the image having each possible intensity value ranging from zero to $2^{16}$. The pixel histogram 30 is plotted as a graph on the display with the vertical coordinate indicating the number of pixels having a given intensity value and the horizontal coordinate indicating each possible intensity value. The operator adjusts the level and width of a window 32 using controls on the operator console. The window 32 can be placed around a special feature such as bulge 31, or the operator may alternatively sweep the histogram 30 by sliding the window 32 across the histogram 30 while watching the displayed image for enhanced tissue features.

While the manual adjustment of window width (WW) and window level (WL) affords the operator with maximum flexibility, it also leads to variations in image quality. This is because the adjustments are prone to operator discretion and operators have different opinions regarding image quality. In addition, the manual adjustment requires time if it is to be done well and this reduces the throughput of the medical imaging system.

SUMMARY OF THE INVENTION

The present invention relates to a method for automatically adjusting the window width (WW) and the window level (WL) of images produced by a magnetic resonance imaging (MRI) system. More particularly, the method includes acquiring the NMR data with an MRI system, reconstructing an image, producing a histogram of the reconstructed image; removing histogram bins with less than a threshold (T) number of pixels; determining the mean intensity of the remaining histogram bins and setting the window level WL to that value; and calculating the window width WW using a fixed scale factor (FAC) according to $$WW = FAC (WL - LPI)$$

where LPI is the lowest pixel intensity value in the thresholded histogram.

A general object of the invention is to automatically set the window level WL and window width WW values for any MRI image. The only manual input is the threshold value (T) which can be set to one value when imaging the spine and set to another value when imaging other anatomy. A scale factor of two (i.e. FAC=2) has been found optimal for all MRI images and it does not have to be changed.

Another object of the invention is to provide consistent high quality images. Consistency is achieved by eliminating the discretionary element from the display process by automatically calculating WL and WW. It has been found that only 8% of the images produced in this manner can be improved diagnostically by further manual manipulation of the WL and WW settings.

Yet another object of the invention is to improve the efficiency with which MRI images are produced. By automatically calculating the WL and WW settings, the operator need not spend any time manipulating the image. Also, these calculations are relatively easy to perform and require very little processing time.

The foregoing and other objects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims herein for interpreting the scope of the invention.

DESCRIPTION OF THE PREFERRED EMBODIMENT

Figure 1:
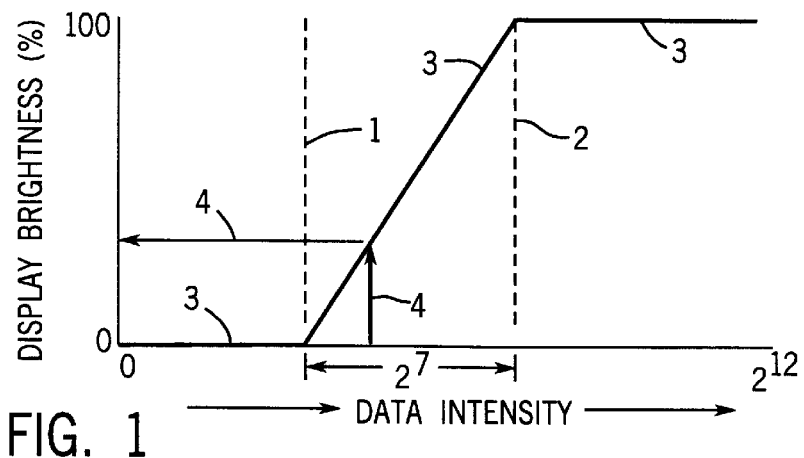
FIG. 1 is a graphic representation of a static contrast window used to map brightness values to a display.
Figure 2:
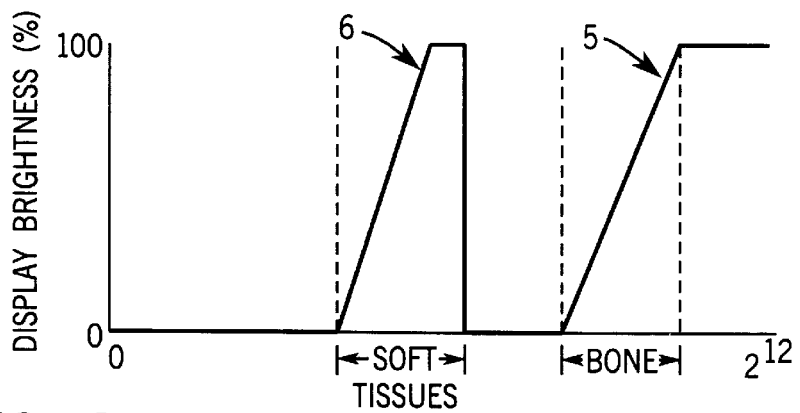
FIG. 2 is a graphic representation illustrating the use of two static contrast windows.
Figure 3:
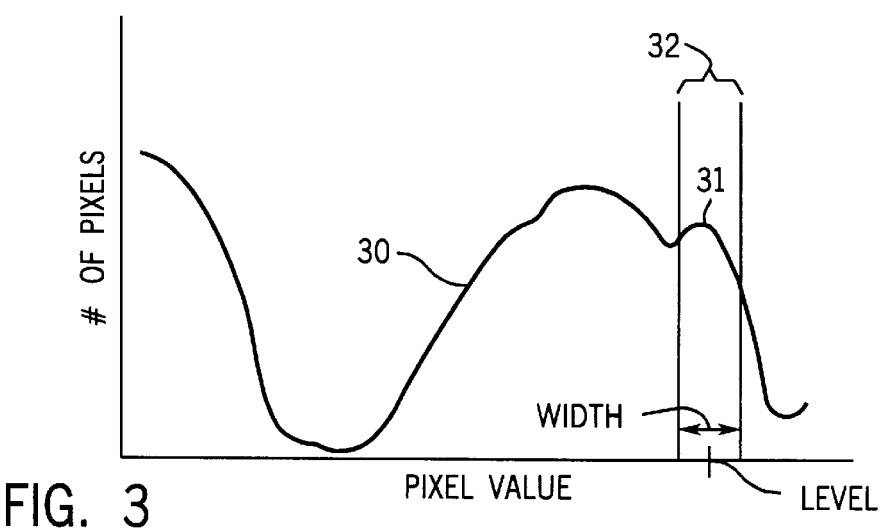
FIG. 3 is an example of a histogram for an image showing a selected window.
Figure 4:
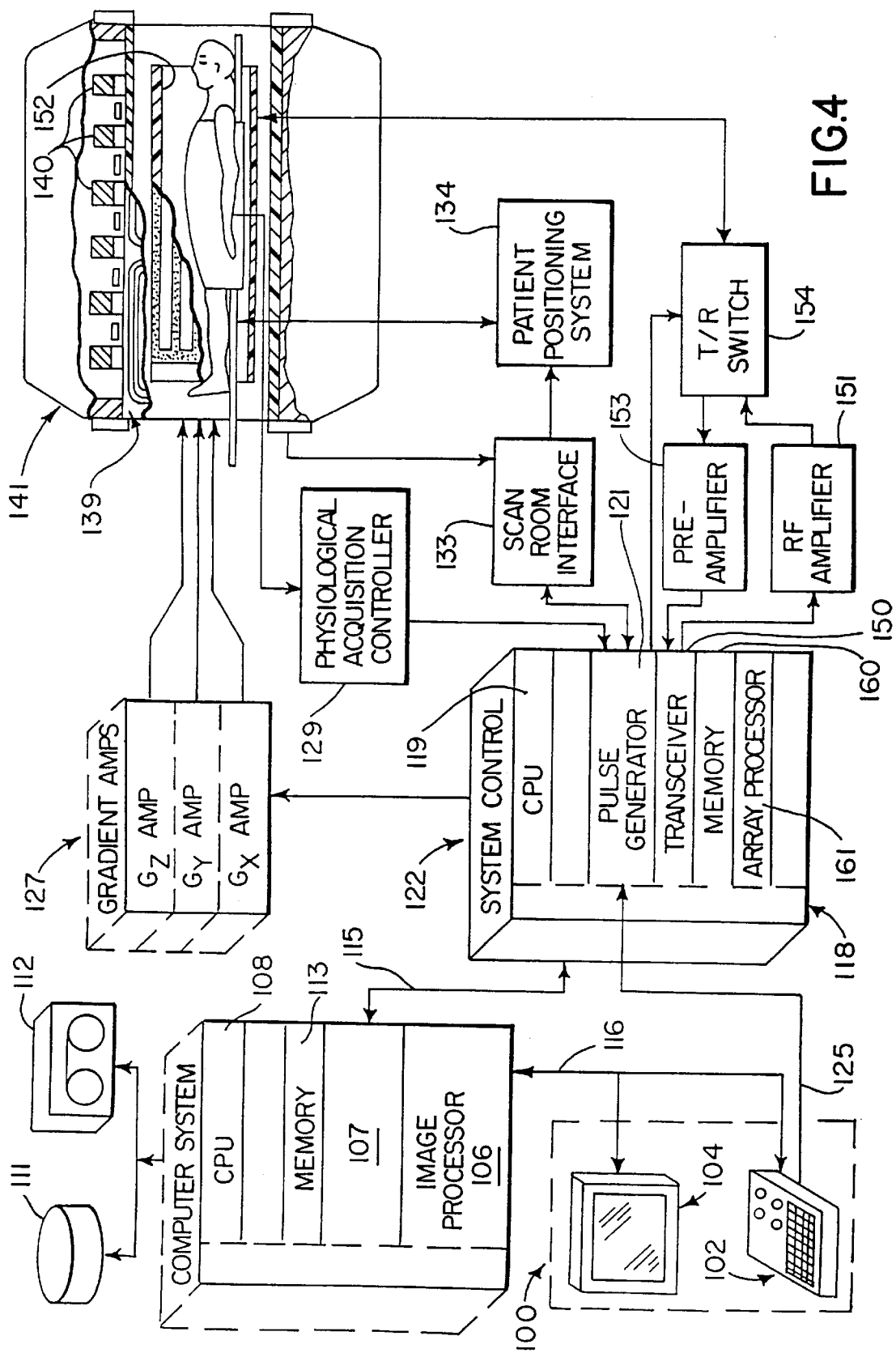
FIG. 4 is a block diagram of an MRI system which employs the present invention.

Referring first to FIG. 4, there is shown the major components of a preferred MRI system which incorporates the present invention. The operation of the system is controlled from an operator console 100 which includes a keyboard and control panel 102 and a display 104. The console 100 communicates through a link 116 with a separate computer system 107 that enables an operator to control the production and display of images on the screen 104. The computer system 107 includes a number of modules which communicate with each other through a backplane. These include an image processor module 106, a CPU module 108 and a memory module 113, known in the art as a frame buffer for storing image data arrays. The computer system 107 is linked to a disk storage 111 and a tape drive 112 for storage of image data and programs, and it communicates with a separate system control 122 through a high speed serial link 115.

The system control 122 includes a set of modules connected together by a backplane. These include a CPU module 119 and a pulse generator module 121 which connects to the operator console 100 through a serial link 125. It is through this link 125 that the system control 122 receives commands from the operator which indicate the scan sequence that is to be performed. The pulse generator module 121 operates the system components to carry out the desired scan sequence. It produces data which indicates the timing, strength and shape of the RF pulses which are to be produced, and the timing of and length of the data acquisition window. The pulse generator module 121 connects to a set of gradient amplifiers 127, to indicate the timing and shape of the gradient pulses to be produced during the scan. The pulse generator module 121 also receives patient data from a physiological acquisition controller 129 that receives signals from a number of different sensors connected to the patient, such as ELG signals from electrodes or respiratory signals from a bellows. And finally, the pulse generator module 121 connects to a scan room interface circuit 133 which receives signals from various sensors associated with the condition of the patient and the magnet system. It is also through the scan room interface circuit 133 that a patient positioning system 134 receives commands to move the patient to the desired position for the scan.

The gradient waveforms produced by the pulse generator module 121 are applied to a gradient amplifier system 127 comprised of $G_x$, $G_y$ and $G_z$ amplifiers. Each gradient amplifier excites a corresponding gradient coil in an assembly generally designated 139 to produce the magnetic field gradients used for position encoding acquired signals. The gradient coil assembly 139 forms part of a magnet assembly 141 which includes a polarizing magnet 140 and a whole-body RF coil 152. A transceiver module 150 in the system control 122 produces pulses which are amplified by an RF amplifier 151 and coupled to the RF coil 152 by a transmit/receive switch 154. The resulting signals radiated by the excited nuclei in the patient may be sensed by the same RF coil 152 and coupled through the transmit/receive switch 154 to a preamplifier 153. The amplified NMR signals are demodulated, filtered, and digitized in the receiver section of the transceiver 150. The transmit/receive switch 154 is controlled by a signal from the pulse generator module 121 to electrically connect the RF amplifier 151 to the coil 152 during the transmit mode and to connect the preamplifier 153 during the receive mode. The transmit/receive switch 154 also enables a separate RF coil (for example, a head coil or surface coil) to be used in either the transmit or receive mode.

The NMR signals picked up by the RF coil 152 are digitized by the transceiver module 150 and transferred to a memory module 160 in the system control 122. When the scan is completed and an entire array of data has been acquired in the memory module 160, an array processor 161 operates to Fourier transform the data into an array of image data. This image data is conveyed through the serial link 115 to the computer system 107 where it is stored in the disk memory 111. In response to commands received from the operator console 100, this image data may be archived on the tape drive 112, or it may be further processed by the image processor 106 in accordance with the present invention and conveyed to the operator console 100 and presented on the display 104.

Figure 5:
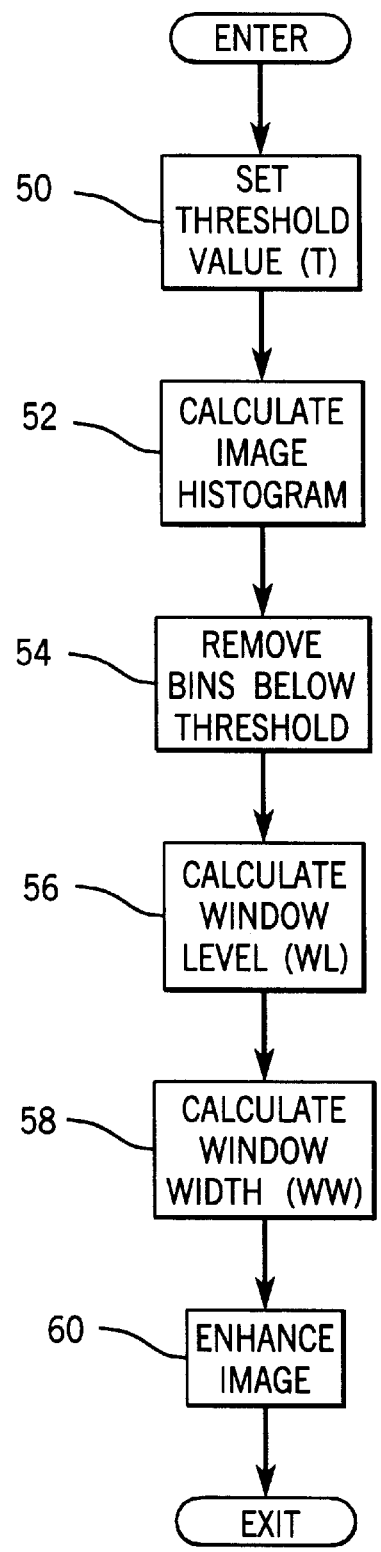
FIG. 5 is a flow chart of the program employed in the MRI system of FIG. 4 which automatically calculates the window level and window width values according to the present invention.

When an image is to be displayed it is processed by the image processor 106 in accordance with a program illustrated in FIG. 5. As indicated by process block 50 the first step is to set the threshold value T that is to be used in the calculations. This is done by the operator in response to a prompt on the display 104. If the image to be processed depicts the spine, the value of T is set to 10, otherwise, the value of T is set to 2. As indicated by process block 52, the histogram is then produced using the values in the reconstructed image array. More specifically, the number of image array values at each of a plurality of intensity levels are counted and stored in "bins". The image data array intensity values are examined one at a time to determine in which bin they fall. The count for that bin is then incremented. When the histogram is complete, each bin is then examined as indicated at process block 54, and those bins with less than T counts are removed by setting their counts to zero.

As indicated by process block 56, the next step is to calculate the window level WL. This is accomplished by calculating the mean intensity level using the remaining counts in the histogram.

$$WL = \sum_{i=1}^{N} H_i * f / n$$

where:
N=number of bins within histogram;
i=histogram bin number;
n=number of bins with counts equal to or greater than $T_j$;
$H_i$=histogram at bin i; and
f="1" if the count at bin i is greater than T or "0" if the count is less than T.

The window width WW is then calculated as indicated at process block 58. This is accomplished according to the following relationship:

$$WW = FAC\ (WL - LPI),$$

where LPI is the lowest pixel intensity level in the thresholded histogram and FAC is a scale factor optimized for the imaging modality. For MRI, it has been found that this scale factor, FAC, can be set to "2" for all MRI imaging procedures. With the calculated values of WW and WL, the image data array is then mapped to the display 104 as indicated at process block 60.

Figure 6:
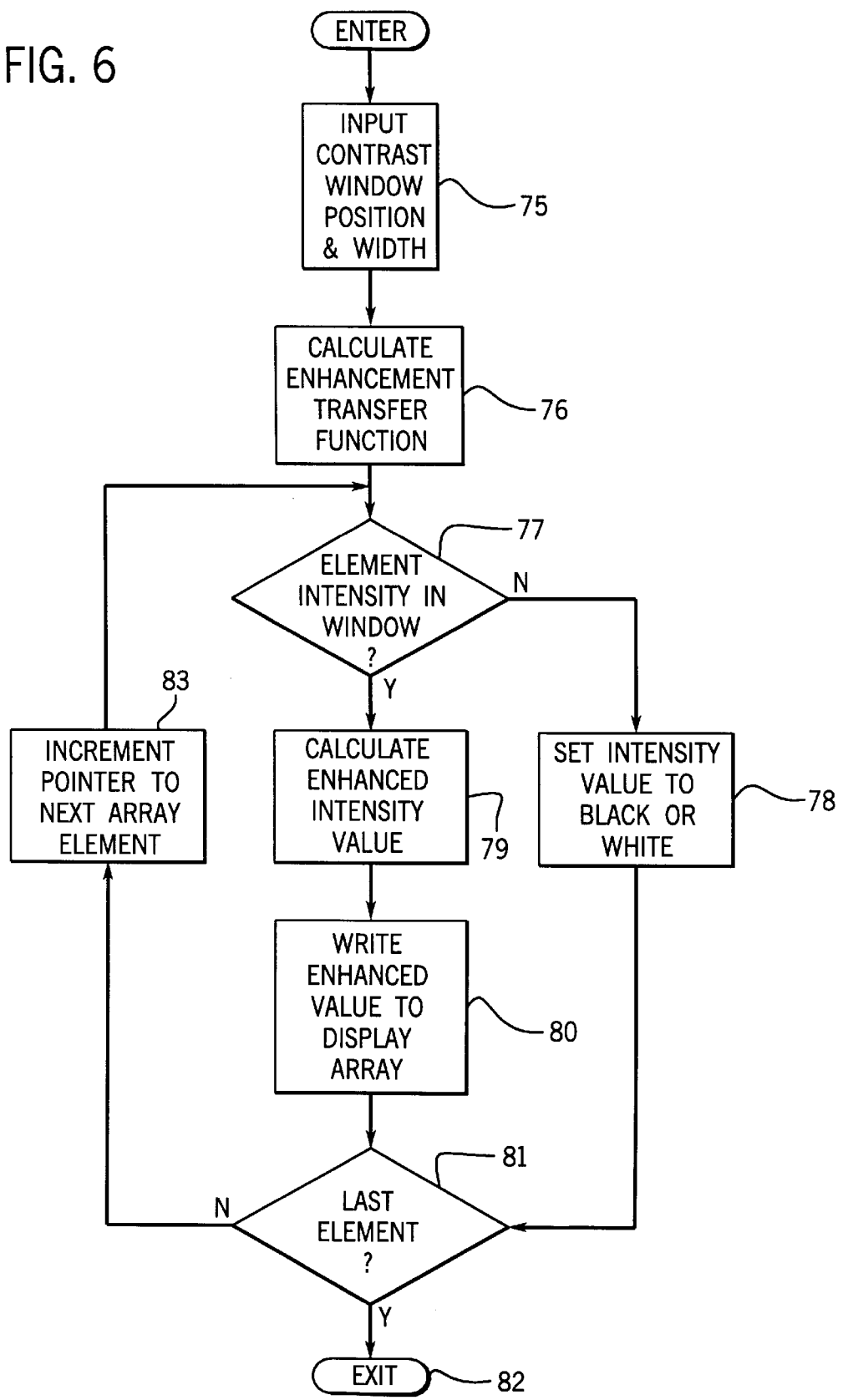
FIG. 6 is a flow chart of a program employed in the MRI system of FIG. 4 which maps an image array to a display that forms part of the MRI system of FIG. 4.

Referring particularly to FIG. 6, the image produced on the display 104 from the values in the image data array is enhanced in accordance with the contrast window values WL and WW. As indicated at process block 75, the contrast window level WL and width WW values are input and a transfer function is calculated from these values as indicated at process block 76. The system then enters a loop in which the value of each element of the image data array is examined and mapped to its corresponding element in the display 104. If the intensity value of the element lies outside the range of the calculated contrast window as determined at decision block 77, the intensity value is set to black if below, and it is set to white if above the window, as indicated at process block 78. In other words, the intensity value is not enhanced. On the other hand, if the intensity value lies within the range of the calculated contrast window, an enhanced intensity value is calculated at process block 79 using the previously calculated transfer function. The enhanced intensity value is then written to the display 104 as indicated at process block 80. The system loops at decision block 81 and the pointer to the next image data array element is incremented at process block 83. After all image data array elements have been processed as determined at deci-

We claim:

1. A method for producing an image of a subject using an imaging system, the steps comprising:
   a) acquiring data from the subject with the imaging system;
   b) reconstructing an image from the acquired data;
   c) producing a histogram of the reconstructed image, said histogram storing in bins the number of image pixels at respective intensity levels;
   d) removing from the histogram bins with less than a threshold (T) number of pixels;
   e) calculating a window level (WL) by determining the mean intensity level of the remaining histogram bins;
   f) calculating a window width (WW) according to the relationship:

$$WW = FAC(WL - LPI),$$

where LPI is the lowest intensity value in the thresholded histogram and FAC is a constant determined by the imaging system.

2. The method as recited in claim 1 in which the threshold T is determined by the particular subject being imaged.

3. The method as recited in claim 2 in which the threshold T has one value when the subject includes the human spine and threshold T has another value when the subject does not include the human spine.

4. The method as recited in claim 1 in which the imaging system is an MRI system which acquires NMR data from the subject and FAC is set to substantially 2.

* * * * *